United States Patent
Krishnamurthy et al.

(10) Patent No.: US 9,824,171 B2
(45) Date of Patent: Nov. 21, 2017

(54) REGISTER FILE CIRCUIT DESIGN PROCESS

(71) Applicant: Apple Inc., Cupertino, CA (US)

(72) Inventors: Harsha Krishnamurthy, San Jose, CA (US); Mridul Agarwal, Sunnyvale, CA (US); Shyam Sundar Balasubramanian, San Jose, CA (US); Christopher S. Thomas, Austin, TX (US); Rajat Goel, Saratoga, CA (US); Rohit Kumar, Santa Clara, CA (US); Muthukumaravelu Velayoudame, Fremont, CA (US)

(73) Assignee: Apple Inc., Cupertino, CA (US)

( * ) Notice: Subject to any disclaimer, the term of this patent is extended or adjusted under 35 U.S.C. 154(b) by 224 days.

(21) Appl. No.: 14/820,223

(22) Filed: Aug. 6, 2015

(65) Prior Publication Data

US 2017/0039299 A1 Feb. 9, 2017

(51) Int. Cl.
*G06F 17/50* (2006.01)

(52) U.S. Cl.
CPC ........ *G06F 17/505* (2013.01); *G06F 17/5068* (2013.01)

(58) Field of Classification Search
None
See application file for complete search history.

(56) References Cited

U.S. PATENT DOCUMENTS

| | | | |
|---|---|---|---|
| 6,405,160 B1 * | 6/2002 | Djaja | G06F 17/5045 703/24 |
| 7,031,204 B2 | 4/2006 | Park et al. | |
| 7,277,353 B2 * | 10/2007 | Goel | G11C 7/10 365/189.14 |
| 8,141,010 B1 | 3/2012 | Kong et al. | |
| 8,584,062 B2 | 11/2013 | Xia et al. | |
| 8,850,371 B2 | 9/2014 | Sprinkle | |
| 9,558,308 B2 * | 1/2017 | Bowers | G06F 17/505 |
| 2004/0153977 A1 | 8/2004 | Wilcox et al. | |
| 2013/0318487 A1 | 11/2013 | Hackney et al. | |
| 2014/0112429 A1 | 4/2014 | Bhatia et al. | |

OTHER PUBLICATIONS

U.S. Appl. No. 14/641,619, filed Mar. 9, 2015, Harsha Krishnamurthy.

* cited by examiner

*Primary Examiner* — Leigh Garbowski
(74) *Attorney, Agent, or Firm* — Meyertons, Hood, Kivlin, Kowert & Goetzel, P.C.

(57) ABSTRACT

In some embodiments, a register file circuit design process includes instructing an automated integrated circuit design program to generate a register file circuit design, including providing a cell circuit design and instructing the automated integrated circuit design program to generate a selection design, a pre-decode design, and a data gating design. The cell circuit design describes a plurality of selection circuits that have a particular arrangement. The selection design describes a plurality of replica circuits that include respective pluralities of selection circuits having the particular arrangement. The pre-decode design describes a pre-decode circuit configured to identify a plurality of entries identified by a portion of a write instruction. The data gating design describes data gating circuits configured, in response to the pre-decode circuit not identifying respective entries, to disable data inputs to respective write selection circuits connected to the respective entries.

20 Claims, 10 Drawing Sheets

REGISTER FILE CIRCUIT DESIGN PROCESS

BACKGROUND

Technical Field

This disclosure relates generally to a register file circuit design process.

Description of the Related Art

Integrated circuit design flow is a complex process. Most often, a functional/behavioral description of the system/circuit is created with use of a register transfer language (RTL) or hardware description language (HDL) such as Verilog or VHDL (Very high speed integrated circuits Hardware Description Language). An important part of the design process is the creation of a logic implementation, and subsequently a transistor level implementation of these behavioral models. The creation of these implementations is oftentimes automated through the use of "synthesis" tools. Generally, a synthesis program is used to generate a netlist from the HDL models, making use of standard cell libraries containing a variety of circuit elements from which the integrated circuit may be constructed. Netlists usually include instances of the standard cells contained in the design, with the possible inclusion of custom blocks, and information descriptive of the connectivity between all the instances included in the integrated circuit. There are different types of netlists that can be used, including physical and logical netlists, instance-based and net-based netlists, and flat and hierarchical netlists. Typically, the final netlist generated by the synthesis tool is dependent on the constructs that appear in the HDL model. In other words, the style and syntax of various functional elements in the HDL oftentimes determines the type of elements and components that appear in the netlist generated by the synthesis tool.

When translating a functional/behavioral description of a circuit into a logic implementation, synthesis tools may attempt to improve or otherwise modify the circuit. Although such modifications may improve characteristics of the circuit at a local level (e.g., specific to a portion of a circuit), these modifications may negatively impact factors such as timing, area, power consumption, or routing complexity of the circuit as a whole. As a result, some circuits are generally manually designed as part of a design process. One such circuit is a register file.

Many integrated circuits (IC's) utilize register files for temporary storage of data. For example, processors utilize register files to store operands for performing operations and for storing results of those operations. The number of registers used may vary from one type of processor to another. Typically, registers may be at the top of a memory hierarchy and thus the closest memory to an execution unit of a processor. A register file may be implemented using a number of bit cells. Each register may include a certain number of bit cells, and a typical register file may include a number of registers. The type of circuitry used to implement bit cells for a register file may vary with the application.

SUMMARY

In various embodiments, a register file circuit design process is disclosed that includes a request for an automated integrated circuit design program to automatically generate at least a portion of a register file circuit design. The request may include instructions to generate several portions of the register file circuit design, including a hierarchy design, a data gating design, a read acceleration design, a write routing design, or any combination thereof. Designing some or all of the register file circuit design using the automated integrated circuit design program may save valuable time for a design engineer. Further, the automated integrated circuit design program may be able to organize the register file circuit design such that an irregularly (e.g., non-rectangular) dimensioned design may be produced in response to requested irregular dimensions.

Additionally, the automated integrated circuit design program may be able to take advantage of design layers (e.g., upper level metal layers) which may be difficult for a design engineer manually designing a register file circuit design to utilize. For example, in some cases, use of an upper level metal layer (e.g., a sixth metal layer (M6)) in a custom portion of a design may cause a design tool, in an attempt to simplify an interface with a designer, to prevent the designer from viewing details of a lower metal layer (e.g., a fifth metal layer (M5)). In some cases, the designer may view the details of the lower metal layer using a more detailed view, however, using this view may show additional circuit complexity, which may result in the designer spending additional effort to verify the custom portion of the design. Additionally, the design tool may unnecessarily prevent the design from utilizing the lower metal layer in an area of the custom portion of the design, resulting in additional design complexity. Further, because, in some cases, the design tool does not understand the functionality of a manually designed register file circuit design (and how the design may be affected by additional circuitry), the design tool may prevent higher level metal layers (e.g., layers above M6) that are associated with other portions of an integrated circuit from being routed over the manually designed register file circuit design. For example, even if the design tool recognizes that a particular area is not utilized by a manually designed register file circuit design, the design tool may prevent the particular area from being utilized by another portion of the integrated circuit in an attempt to maintain symmetry. Such an approach may result in an undesirable routing design (e.g., a routing design that is undesirably long), which may affect timing and/or area characteristics of the integrated circuit design. Accordingly, because the automated integrated circuit design program may be able to take advantage of the design layers to add additional circuitry (e.g., wires, repeaters, additional logic cells, etc.), characteristics of the integrated circuit design may be improved.

In one embodiment, the request to generate a register file design includes instructions to generate a hierarchy design, where the instructions include a cell circuit design describing a plurality of selection circuits that have a particular arrangement (e.g., a hierarchical arrangement) and may cause the automated integrated circuit design program to refrain from attempting to improve or otherwise modify the cell circuit design. The hierarchy design may include a selection design describing a plurality of replica circuits that include respective pluralities of selection circuits having the particular arrangement. Accordingly, the automated integrated circuit design program may be used to generate portions of the register file circuit design but a design engineer may be able to control how the hierarchy design is created, thus enabling the design engineer to manually preserve certain characteristics (e.g., routing) of the hierarchy design.

In one embodiment, the request to generate a register file design includes instructions to generate a data gating design.

The data gating design may include a write pre-decode design describing a write pre-decode circuit configured to identify a plurality of entries of the register file identified by a portion of a write instruction. The data gating design may further include a gating design describing a plurality of data gating circuits configured, in response to the write pre-decode circuit not identifying a respective plurality of entries of the register file circuit, to disable at least one data input to at least one respective write selection circuit connected to the respective plurality of entries. Accordingly, in some cases, the data gating design may reduce dynamic power usage associated with unnecessarily sending the at least one data input to the at least one write selection circuit.

In one embodiment, the request to generate a register file design includes instructions to generate a read acceleration design. The read acceleration design may include a read pre-decode design describing a read pre-decode circuit configured to identify a portion of a read address, where, in response to receiving the read address, a plurality of selection circuits are configured to electrically connect a particular entry of the register file to a read port. The read acceleration design may further include a read index storage design describing a read index storage device configured to store the portion of the read address and to send the portion of the read address to a subset of the plurality of selection circuits such that the subset of the plurality of selection circuits receives the portion of the read address earlier than other selection circuits of the plurality of selection circuits. Accordingly, in some cases, data corresponding to a read may be propagated through portions of the plurality of selection circuits more quickly, which may decrease a read latency associated with the register file circuit design.

In one embodiment, the request to generate a register file design includes instructions to generate a write routing design. The write routing design may include a write port selection design describing a plurality of write port selection circuits configured, in response to a plurality of write port selection signals, to electrically connect a particular entry to a particular write port. The write routing design may further include a routing design describing encoding circuitry configured to encode a plurality of write index signals, and send the plurality of write index signals to the plurality of write selection circuits such that the plurality of write port selection signals are routed within the register file circuit design as an encoded plurality of write port selection signals, where the plurality of write selection circuits are configured, in response to the encoded plurality of write port selection signals, to electrically connect the particular entry to the particular write port. In some cases, the write routing design may reduce an area corresponding to the wires configured to carry the write port selection signals. Although the write routing design may increase a latency associated with the write port selection signals (e.g., corresponding to encoding the plurality of write index signals and to decoding or otherwise interpreting the plurality of write index signals), this tradeoff may be worthwhile due to other considerations or constraints associated with write operations (e.g., because the data written in the write operation may not be needed for several cycles).

Figure 1:
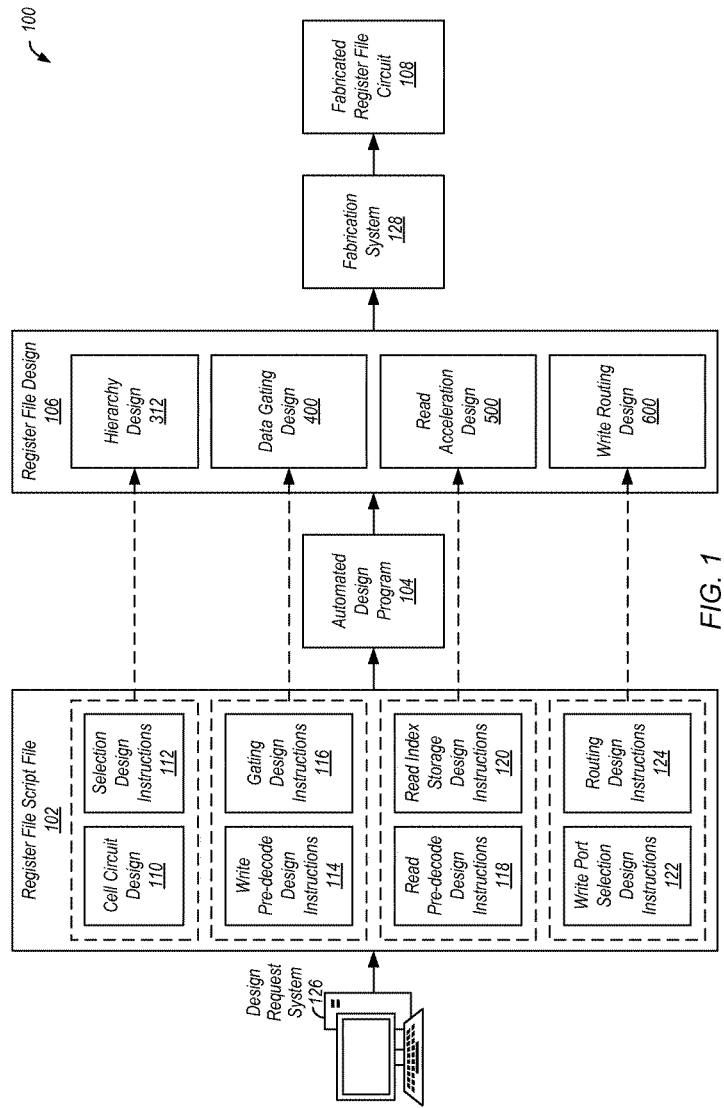
FIG. 1 is a block diagram illustrating one embodiment of an exemplary register file circuit generation system configured to perform an exemplary register file circuit design process.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f), for that unit/circuit/component.

As used herein, the term "based on" describes one or more factors that affect a determination. This term does not foreclose additional factors that may also affect the determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B. Additionally, where B includes multiple elements (e.g., multiple data values), A is determined based on B as long as at least one of the elements of B affects the determination of A.

As used herein, the phrase "in response to" describes one or more factors that trigger an effect. This phrase does not foreclose additional factors that may also affect or otherwise trigger the effect. That is, an effect may be solely in response to those factors, or may be in response to those factors as well as in response to other factors. Consider the phrase "perform A in response to B." While in this case, B is a factor that triggers the performance of A, such a phrase does not foreclose the performance of A from also being in response to C. In other instances, A may be performed solely in response to B.

As used herein, the terms "first," "second," etc., unless otherwise specified, are used as labels for nouns that they precede, and do not imply any type of ordering (e.g., spatial, temporal, logical, etc.). For example, in a storage device having eight entries, the terms "first entry" and "second entry" can be used to refer to any two of the eight entries.

DETAILED DESCRIPTION

Register files are used in various functional blocks of central processing unit (CPU) design, such as being used for temporary storage of data during arithmetic, logic, data manipulation, and cryptography operations. As described above, such register files are traditionally manually designed, especially when large (e.g., 128 entries or 10,000 entries), multi-ported (e.g., 10 read ports and 4 write ports or 1000 read ports and 500 write ports), high-speed (e.g., 2 gigahertz (GHz) or 2 terahertz (THz)) designs are desired. Some or all of the processes described herein may be utilized to automatically generate such a large, multi-ported, high speed register file circuit design. This register file circuit design can be used in conjunction with a fabrication process to create a register file circuit (e.g., as part of a larger integrated circuit or as a separate circuit). Although specific numbers are provided regarding the number of entries, the number of ports, and the speed of the register file circuit design, they are provided simply for illustration. Other larger or smaller numbers may instead be used.

The phrase "register file" is used herein according to its accustomed meaning in the art, including a memory circuit having a number of entries (e.g., bit cells) that can be used to store and provide data upon request. The register file includes one or more write ports that can be utilized to store data in the entries and one or more read ports that can be utilized to receive data stored at the entries.

The phrase "automated circuit design program" is used herein according to its accustomed meaning in the art to refer to a series of instructions or commands implemented in hardware or software that is able to receive a description of a circuit (e.g., a RTL description or a HDL script such as a Verilog script or a VHDL script) and automatically generate a mapping (e.g., a very-large-scale-integration (VLSI) layout design) that can be used as part of a fabrication process.

As used herein, "automatically" performing some action (e.g., generate a design) refers to that action being performed without requiring additional user input. For example, an instruction to an automated circuit design program that causes design information to be generated without the need for further user input results in automatically generated design information.

As used herein, "synthesizable" refers to a set of instructions sufficient to generate a physical design. For example, a set of instructions are synthesizable when they can be interpreted by a tool (or several tools) to generate a physical design, such as an application specific integrated circuit.

As used herein, a plurality of circuits having a "hierarchical arrangement" describes a plurality of circuits organized according to a tiered series having a specific organization. For example, a 4:1 multiplexer (MUX) may be created using three 2:1 MUXes having a hierarchical arrangement in which outputs of two of the 2:1 MUXes (e.g., serving as a first tier) are input into the third of the 2:1 MUXes (e.g., serving as a second tier).

As used herein, a "netlist" refers to a description of a set of conductors on which signal outputs by cells/circuits are communicated to one or more input pins of one or more other cells/circuits. The netlist may describe multiple end points (one output and multiple inputs, or even multiple output pins if the cells are controlled to avoid contention). The netlist may also describe conductors at more than one metal layer in the integrated circuit, as well as vias between the layers, etc. The conductors may also be referred to as wires.

As used herein, a design having "irregular dimensions" refers to a design that that describes a circuit having a non-rectangular physical shape. For example, a design shaped like the letter "H" has irregular dimensions.

In sum, a register file circuit design process is disclosed that includes, in one embodiment a request for an automated integrated circuit design program to automatically generate various portions of a register file circuit design. These portions, including a hierarchy design, a data gating design, a read acceleration design, and a write routing design will be further described below. In some embodiments, the automated integrated circuit design program generates all of the designs described herein. Accordingly, some components may be common to multiple designs. In other embodiments, the automated integrated circuit design program generates only some of the designs described herein. Accordingly, the circuit designs described herein may be combined with other circuit designs which may be generated by the automated integrated circuit design program or by another process (e.g., another design program or a manual design). The techniques described herein allow automatic generation of large, multi-ported, high speed register file circuit designs.

Designing some or all of the register file circuit design using the automated integrated circuit design program may save valuable time for a design engineer. Additionally, as described above, the automated integrated circuit design program may be able to take advantage of additional design layers (e.g., upper level metal layers) which may be difficult for a design engineer to utilize. Moreover, the automated integrated circuit design program may be able to organize the register file circuit design such that an irregularly dimensioned design may be produced in response to requested irregular dimensions.

This disclosure initially describes, with reference to FIG. 1, an embodiment of an exemplary register file circuit generation system configured to perform an exemplary register file circuit design process. A more detailed register file circuit design process is described with reference to FIG. 2. FIGS. 3-6 illustrate various circuits that are described by various designs that may be generated as part of a register file circuit design process. Different methods performed to initiate various embodiments of a register file circuit design process are described with reference to FIGS. 7 and 8. A non-transitory computer readable medium storing instructions that, when executed by a processor, cause the processor to initiate or perform various portions of a register file circuit design process is described with reference to FIG. 9. Finally, an exemplary computing system configured to perform at least a portion of a register file circuit design process is described with reference to FIG. 10.

Turning now to FIG. 1, a block diagram of one embodiment of an exemplary register file circuit generation system 100 configured to perform an exemplary register file circuit design process is shown. In the illustrated embodiment, register file circuit generation system 100 includes design request system 126, register file script file 102, automated design program 104, register file design 106, fabrication system 128, and fabricated register file circuit 108. In the illustrated embodiment, register file script file 102 includes cell circuit design 110, selection design instructions 112, write pre-decode design instructions 114, gating design instructions 116, read pre-decode design instructions 118, read index storage design instructions 120, write port selection design instructions 122, and routing design instructions 124. In the illustrated embodiment, register file design 106 includes hierarchy design 312, data gating design 400, read acceleration design 500, and write routing design 600. (Each of these designs refers to a set of information that is usable, individually or in combination with information from other designs, to fabricate at least a portion of the register file.) In other embodiments, as further discussed below, register file script file 102 does not include all of the illustrated design and instruction data, and may additionally include other design and/or instruction data. Similarly, in other embodiments, as further discussed below, register file design 106 does not include all of the illustrated designs, and may additionally include other designs. Although design request system 126 and fabrication system 128 are depicted as separate systems, in some embodiments, design request system 126 and fabrication system 128 may be co-located (part of a same system).

Design request system 126 represents one or more computer systems utilized to generate register file script file 102 and to request that automated design program 104 generate register file design 106. In some embodiments, design request system 126 receives data used to form register file script file 102 from one or more circuit design engineers. For example, design request system 126 may receive cell circuit design 110 from one circuit design engineer and may receive write pre-decode design instructions 114 from another circuit design engineer. Design request system 126 may provide one or more resources to assist design engineers in providing the data objects used to form register file script file 102 including word processor or visual design resources that can be used to form designs and/or instructions that can be interpreted by automated design program 104. After receiving an indication that register file script file 102 is complete, design request system 126 may send register file script file 102 to automated design program 104, which may be running on design request system 126 or another computer system (e.g., fabrication system 128).

Register file script file 102 includes data objects (e.g., cell circuit design 110 and routing design instructions 124) that, collectively, instruct automated design program 104 to generate register file design 106. In the illustrated embodiment, the data objects are broken into several groups of related data objects that, together, instruct automated design program 104 to generate corresponding circuit designs in register file design 106. In other embodiments, register file script file 102 includes a subset of the illustrated data objects (e.g., in some cases, register file script file 102 does not include cell circuit design 110 and selection design instructions 112). Additionally, register file script file 102 may include additional designs or instructions that instruct automated design program 104 to include other circuitry or functionalities in register file design 106. In some embodiments, register file script file 102 may be sent from design request system 126 to automated design program 104 as a series of scripts (e.g., files, data objects, design instructions, compiled code, etc.) that, collectively, may be used to form register file script file 102.

As used herein, the phrase "instructing an automated integrated circuit design program" is intended to be interpreted broadly. It includes any manner of sending a series of instructions to an automated design program, such as via one or more scripts (whether compiled or uncompiled), command-line parameters, one or more executables, visual interactions with the program (e.g., a computer aided drafting (CAD) program), or any combination thereof. The phrase is intended to cover instructing an automated design program to run an executable to automatically generate portions of the design.

Automated design program 104 (e.g., an automated integrated circuit design program) generates integrated circuit designs in response to requests (e.g., script files) from design request system 126. Automated design program 104 may be a synthesis tool (e.g., a HDL compiler or a RTL compiler). In the illustrated embodiment, automated design program 104 generates register file design 106 from register file script file 102. In some embodiments, automated design program 104 may (e.g., in response to a request from register file script file 102) attempt to improve (e.g., rearrange without logically modifying) portions of a requested register file circuit design. Accordingly, automated design program 104 may modify placement or logical structure of the register file circuit design based on one or more factors, such as estimated timing, estimated power consumption, estimated area, or any combination of these factors (for example, placement may be modified based on estimated timing and power consumption, but not estimated area, in one embodiment). Additionally, in some embodiments, by utilizing such placement modification capabilities, automated design program 104 is able to generate designs that include design features that are difficult to create using manual design processes, such as utilizing upper level metal layers or creating irregularly dimensioned register file designs. In some cases, generating register file script file 102 and using automated design program 104 may generate register file design 106 more quickly, as compared to generating register file design 106 manually. As discussed further below with reference to FIG. 3, the fact that automated design program 104 has produced a particular design does not mean that such a design is superior to a previous design or to a design produced manually. Additionally, as discussed further below, the fact that automated design program 104 is instructed to generally produce a particular design does not mean that register file script file 102 cannot specify features (e.g., specific topological placement of portions of the design) to be included in register file design 106.

Register file design 106 is a design (e.g., a VLSI layout design) of a register file created in response to register file script file 102. As used herein, a "design" refers to a set of information that describes a circuit that can be fabricated by a fabrication system such as fabrication system 128 to produce a physical instantiation of the circuit. Although FIG. 1 depicts register file design 106 as including several distinct designs (e.g., hierarchy design 312 and read acceleration design 500), in some embodiments, these designs may include common or overlapping components. In a particular embodiment, automated design program 104 receives sufficient information from register file script file 102 such that register file design 106 is a single, integrated circuit design. Accordingly, register file design 106 includes sufficient information to inform fabrication system 128 of a requested structure of a requested register file (e.g., sufficient for mask formation and other fabrication techniques).

Fabrication system 128 generates fabricated integrated circuits in response to receiving integrated circuit designs using one or more integrated circuit fabrication techniques. Accordingly, in response to receiving register file design 106, fabrication system 128 generates fabricated register file circuit 108. In some embodiments, fabricated register file circuit 108 is generated as part of a larger circuit (e.g., a CPU design) or may be fabricated as a stand-alone circuit (e.g., a circuit configured to be integrated into a CPU circuit).

As further described below with reference to FIG. 3, in some embodiments, cell circuit design 110 and selection design instructions 112 cause automated design program 104 to generate hierarchy design 312. Specifically, cell circuit design 110 describes a plurality of selection circuits that have a particular (e.g., hierarchical) arrangement. In some embodiments, cell circuit design 110 is generated as a result of an interactive design program configured to assist a circuit design engineer in manually generating a circuit design. Alternatively, cell circuit design 110 may be automatically generated. Cell circuit design 110 may include a synthesizable HDL script that describes the plurality of selection circuits. Additionally or alternatively, cell circuit design 110 may include a netlist script that describes connections between the plurality of selection circuits. Selection design instructions 112 instruct automated design program 104 to generate hierarchy design 312 (e.g., a selection design) describing a plurality of replica circuits (circuits that at least include respective pluralities of selection circuits having the particular arrangement of cell circuit design 110).

As further described below with reference to FIG. 4, in some embodiments, write pre-decode design instructions 114 and gating design instructions 116 cause automated design program 104 to generate data gating design 400. Specifically, write pre-decode design instructions 114 instruct automated design program 104 to generate a write pre-decode design describing a write pre-decode circuit configured to identify a plurality of entries of the register file identified by a portion of a write instruction. Gating design instructions 116 instruct automated design program 104 to generate data gating design 400 describing a plurality of data gating circuits configured, in response to the write pre-decode circuit not identifying a respective plurality of entries of the register file circuit, to disable at least one data input to at least one respective write selection circuit connected to the respective plurality of entries.

This disclosure refers, in various instances, to providing instructions to automated design program 104 to generate different circuit designs. For example, the preceding paragraph refers to "instruct[ing] automated design program 104 to generate data gating design 400 describing a plurality of data gating circuits configured, in response to the write pre-decode circuit not identifying a respective plurality of entries of the register file circuit, to disable at least one data input to at least one respective write selection circuit connected to the respective plurality of entries." As indicated, data gating design 400 includes design information that describes a plurality of data gating circuits. When these circuits are fabricated according to the design information, they will be configured to perform certain actions (e.g., disable at least one data input . . . ). Accordingly, as used herein, a phrase of the form "instructing automated design program to generate a design describing a circuit configured to . . . " does not imply that the circuit in question must be fabricated in order for the element to be met. Rather, this phrase indicates that the design information describes a circuit that, upon being fabricated, will be configured to perform the indicated action.

As further described below with reference to FIG. 5, in some embodiments, read pre-decode design instructions 118 and read index storage design instructions 120 cause automated design program 104 to generate read acceleration design 500. Specifically, read pre-decode design instructions 118 instruct automated design program 104 to generate a read pre-decode design describing a read pre-decode circuit configured to identify a portion of a read address. In response to receiving the read address, a plurality of selection circuits may be configured to electrically connect a particular entry of the register file to a read port. Read index storage design instructions 120 instruct automated design program 104 to generate a read index storage design that, with the read pre-decode design, forms read acceleration design 500. The read index storage design describes a read index storage device configured to store the portion of the read address and to send the portion of the read address to a subset of the plurality of selection circuits such that the subset of the plurality of selection circuits receives the portion of the read address earlier than other selection circuits of the plurality of selection circuits.

As further described below with reference to FIG. 6, in some embodiments, write port selection design instructions 122 and routing design instructions 124 cause automated design program 104 to generate write routing design 600. Specifically, write port selection design instructions 122 instruct automated design program 104 to generate a write port selection design describing a plurality of write port selection circuits configured, in response to a plurality of write port selection signals, to electrically connect a particular entry to a particular write port. Routing design instructions 124 instruct automated design program 104 to generate a routing design that, with the write port selection design, forms write routing design 600. The routing design describes encoding circuitry configured to encode a plurality of write index signals, and to send the plurality of write index signals to the plurality of write selection circuits such that the plurality of write port selection signals are routed within the register file circuit design as an encoded plurality of write port selection signals. The plurality of write selection circuits may be configured, in response to the encoded plurality of write port selection signals, to electrically connect the particular entry to the particular write port (e.g., connect such that an electrical signal can be carried from the particular entry to the particular write port).

Accordingly, register file circuit generation system 100 may be used to automatically generate register file design 106 in response to register file script file 102 and further generate fabricated register file circuit 108 in response to register file script file 102. As described above, in some cases, using register file circuit generation system 100 to generate register file design 106 may be faster than manually generating a register file design. Additionally, using register file circuit generation system 100 may result in a design that can take advantage of additional circuit features (e.g., upper level metal layers) that may be difficult to utilize by manually generating a register file design. Finally, using register file circuit generation system 100 may enable generation of irregularly dimensioned register files, which may enable more efficient area utilization by a final circuit design.

Figure 2:
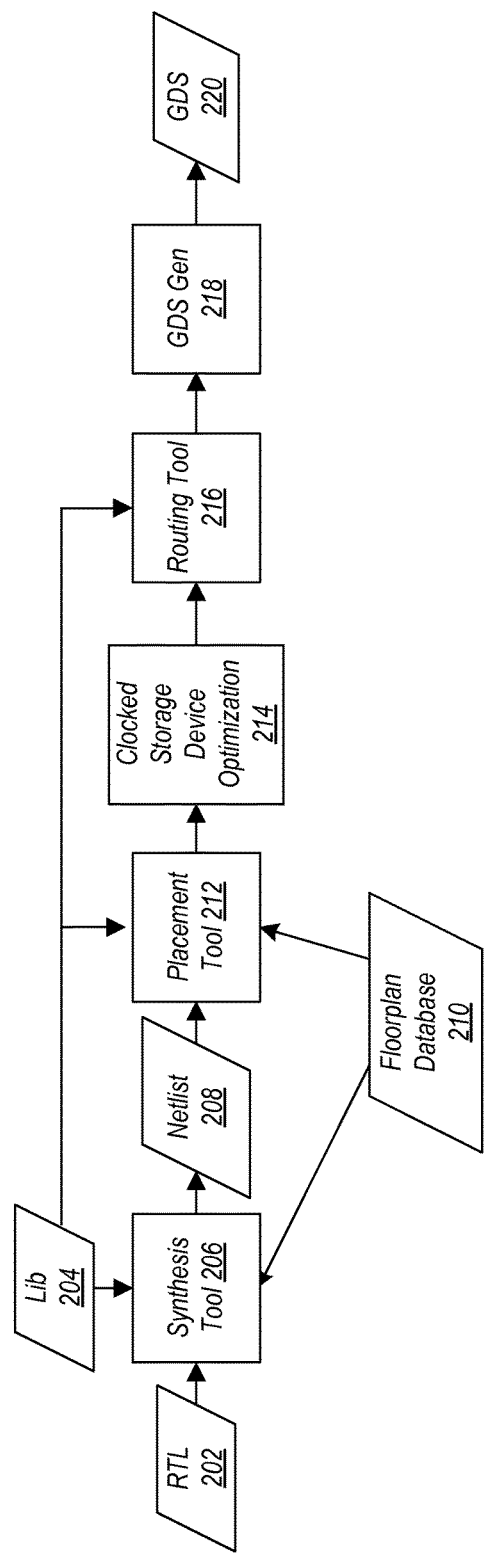
FIG. 2 is a block diagram illustrating one embodiment of an exemplary register file circuit design process.

Turning now to FIG. 2, a block diagram illustrating one embodiment of a process 200 for designing a register file circuit is depicted. Process 200 may describe actions performed by automated design program 104 of FIG. 1. Process 200 begins with a register transfer level (RTL) description 202 of requested logic of the desired register file circuit, which may be included in register file script file 102. RTL description 202 is input into synthesis tool 206, which also has access to a library 204 of predesigned circuit "cells". In certain embodiments, these cells include flip-flops such as single-bit flip-flops or multi-bit flip-flops. Additionally, RTL description 202 may include custom cells such as cell circuit design 110. RTL description 202 may be expressed in any hardware description language (HDL) such as Verilog, Very High Speed Integrated Circuit Hardware Description Language (VHDL), etc. RTL description 202 may be a behavioral level description if the synthesis tool 206 is a behavioral synthesis tool. The output of the synthesis tool 206 may be netlist 208, which may be a list of instances of the cells from the library 204 and the connection between the cell instances that realizes the RTL description 202. The connection may be expressed using the same signal name between a given output pin of a cell (e.g., a flip-flop cell) and the input pin(s) of other cells to which the output pin is connected. Netlist 208, which may also be included in register file script file 102, may further include instances of a custom circuit design created by the designer and not included in the library 204 for general use. The custom circuits may be directly instantiated in RTL description 202 and may not be changed by synthesis tool 206.

Additionally, a floorplan database 210 may be developed with a floorplan database tool (not shown). The floorplan database 210 may be developed, e.g., based on the blocks into which the register file circuit is divided and their expected areas and/or geometric shape on the register file circuit.

Netlist 208 and floorplan database 210 may be input to placement tool 212, which may determine a physical arrangement of the cells/circuits (including flip-flop cells) on the surface of a semiconductor substrate which will form the register file circuit when manufactured. Placement tool 212 may receive description from library 204 of the size of each cell (x and y directions) and the location of input and output pins on each cell (e.g., input and output pins on flip-flop cells). Placement tool 212 may take into account which pins of each cell instance are coupled to which pins of other cell instances in making the placement, as well as the overall dimensions of the register file circuit (or the block within the register file circuit, if RTL description 202 is for less than the entire register file circuit). Similarly, placement tool 212 may take into account overall dimensions of an integrated circuit that includes the register file circuit. Placement tool 212 may assign a placement location of standard cells and saves the assigned placement location in the physical design database (e.g., annotating placement information—location co-ordinates and cell orientation for each standard cell). In some cases, placement is specified (e.g., as a part of register file script file 102). In such cases, placement tool 212 prioritizes requested placement locations.

In certain embodiments, the cells include clocked storage devices (e.g., storage devices which may be used as entries or other storage locations within a register file) and the placement tool 212 includes clocked storage device optimization 214. A clocked storage device may be any storage device that is configured to capture input data in response to a clock and to store the input data until the next clock. Additionally, the clocked storage device may be configured to transmit (or "launch") the stored data on the output of the device responsive to the clock as well. In certain embodiments, the clocked storage device is a multi-bit clocked storage device. Examples of multi-bit clocked storage devices include, but are not limited to, multi-bit flip-flops, multi-bit latches, multi-bit registers, and other multi-bit sequential elements.

In some embodiments, clocked storage device optimization 214 includes assessing properties of the clocked storage devices and remapping of input and output pins to the clocked storage devices. For multi-bit clocked storage devices, remapping may include remapping individual clocked storage device input/output pins between different multi-bit clocked storage devices. In some embodiments, clocked storage device optimization 214 includes applying timing corrections to one or more cells.

The resulting design from clocked storage device optimization 214 may be input to routing tool 216. In some embodiments, routing tool 216 may generate descriptions of metal layers for the register file circuit, connecting output pins to input pins as specified by netlist 208. Routing tool 216 may generally determine the routing for each net specified in netlist 208. The output of routing tool 216 may further update the design. Once the design is complete, the design may be ultimately provided to a graphic data system (GDS) generator 218, which may generate GDS description 220 of the register file circuit (e.g., corresponding to register file design 106). GDS description 220 may be transmitted to a foundry (e.g., fabrication system 128) that manufactures the register file circuit (e.g., fabricated register file circuit 108). The information in GDS description 220 may be used for mask fabrication and other processing at the foundry to produce the register file circuit.

Figure 3:
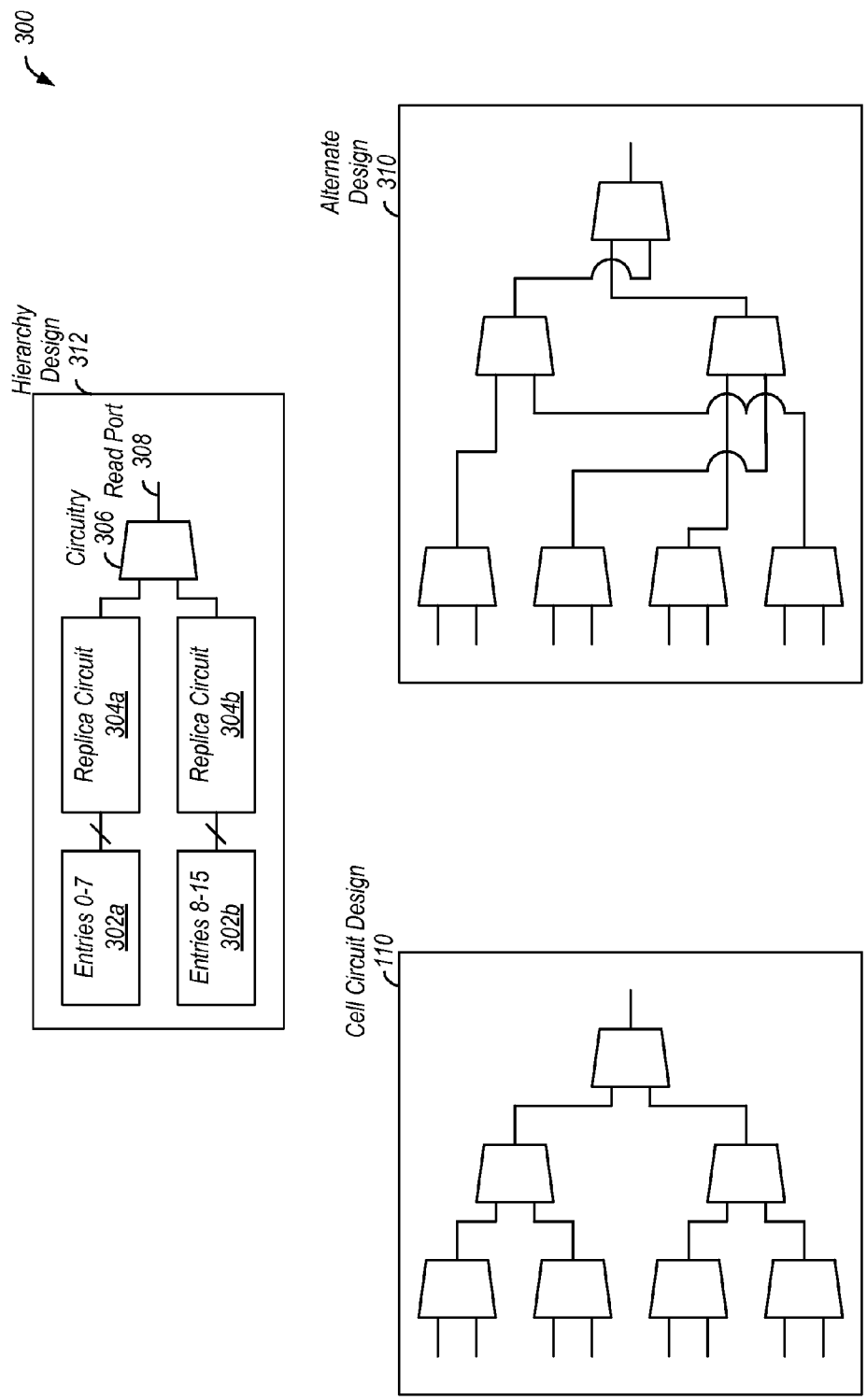
FIG. 3 is a block diagram illustrating one embodiment of a hierarchy design methodology.

Turning now to FIG. 3, a block diagram illustrating an exemplary hierarchy design methodology 300 is shown. In the illustrated embodiment, methodology 300 illustrates a circuit described by hierarchy design 312, a circuit described by cell circuit design 110, and a circuit described by alternate design 310. The circuit described by hierarchy design 312 includes entries 302a-b, two instances of replica circuit 304a-b, circuitry 306, and read port 308. Although a 16-entry, single read port device is illustrated, in other embodiments, a larger number of entries (e.g., 128 entries) and additional read ports may be used.

As used herein, a "replica circuit" refers to a circuit that is an exact copy of another circuit. For example, replica circuit 304a exactly copies the logical arrangement of cell circuit design 110, which is received from register file script file 102 of FIG. 1.

As described above, in some embodiments, automated design program 104 may automatically generate hierarchy design 312 in response to cell circuit design 110 and selection design instructions 112. In particular, register file script file 102 may include cell circuit design 110, which, in the illustrated embodiment, describes a plurality of selection circuits (e.g., multiplexers) having a particular arrangement. In the illustrated embodiment, an 8:1 multiplexer is illustrated. In the illustrated embodiment, selection design instructions 112 instruct automated design program 104 generate a design in which two instances of the cell circuit design (replica circuits 304a-b) are connected to respective groups of 8 entries of the register file and are further connected to respective inputs of circuitry 306. Selection design instructions 112 may further instruct automated design program 104 to connect an output of circuitry 306 to read port 308, thus generating hierarchy design 312.

As discussed above, in some embodiments, register file script file 102 instructs automated design program 104 to attempt to improve (e.g., rearrange without logically modifying) a design described by register file script file 102. However, in some cases, automated design program 104 may undesirably affect characteristics of the register file as a whole in an attempt to improve a small portion of the register file. To illustrate, alternate design 310 is similar to cell circuit design 110, and, if changes are made in associated logic (e.g., changes to associated control logic or to a MUX design used by alternate design 310), alternate design 310 may be logically equivalent to cell circuit design 110. In some cases, alternate design 310 may be logically equivalent to cell circuit design 110. Automated design program 104 may determine that alternate design 310 is, in some cases, superior to cell circuit design 110 according to certain criteria (e.g., due to better placement characteristics, timing characteristics, area characteristics, power consumption, or any combination thereof). Accordingly, automated design program 104 may determine that replica circuit 304a should be organized according to alternate design 310 and replica circuit 304b should be organized according to cell circuit design 110. However, such a design may have undesirable effects which may not be observed by automated design program 104. For example, such a design may result in signals from replica circuit 304a (corresponding to alternate design 310) being unable to reach circuitry 306 within a desired time (e.g., due to additional delay resulting from the additional wiring in alternate design 310). Another potential problem is that the additional wiring in alternate design 310 may complicate routing, potentially making routing infeasible while using a desired area constraint. Accordingly, in the illustrated embodiment, the automated design program 104 is told not to attempt to improve the cell circuit design 110 (is told to use the particular arrangement of selection circuits described by cell circuit design 110) in hierarchy design 312 such that replica circuits 304a-b both have the arrangement described by cell circuit design 110.

Similarly, as described above, automated design program 104 may modify placement of portions of circuits described by register file script file 102. As described above, modifying placement of portions of circuits may enable automated design program 104 to take advantage of additional design layers or to form irregularly dimensioned designs. However, such modifications may, in some cases, negatively impact some characteristics of the register file (e.g., latency of read accesses). Accordingly, in the illustrated embodiment, selection design instructions 112 may indicate placement (e.g., adjacent to an edge that includes a read port) associated with one or more portions (e.g., replica circuits 304a-b) of the register file described by register file script file 102 to be included in the register file design 106. In some cases, a topology that specifies placement of several circuits to be included in register file design 106 may be included in register file script file 102.

Although in the illustrated embodiment, cell circuit design 110 includes only multiplexers, in other embodiments, cell circuit design 110 may include other circuitry. Additionally, in some cases, cell circuit design 110 may include entries 302a-b (e.g., such that connections between circuitry of cell circuit design 110 and entries 302a-b is fixed).

Figure 4:
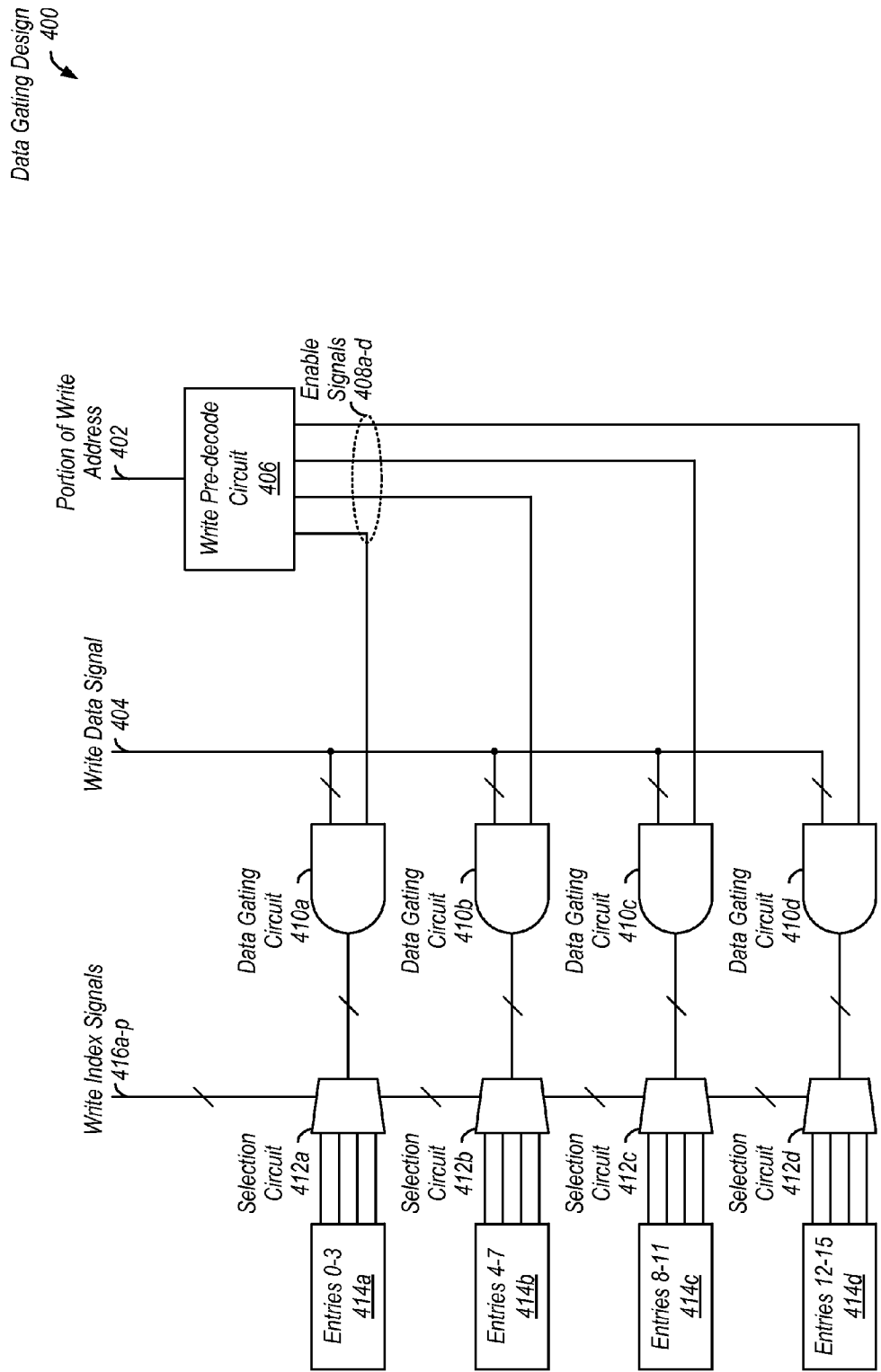
FIG. 4 is a block diagram illustrating one embodiment of a circuit described by a data gating design.

Turning now to FIG. 4, a block diagram illustrating an exemplary embodiment of a circuit described by data gating design 400 is shown. In the illustrated embodiment, data gating design 400 describes an input configured to receive a signal indicative of a portion of a write address 402, a write pre-decode circuit 406, a plurality of enable signals 408a-d, a write data signal 404, a plurality of data gating circuits 410a-d, a plurality of write index signals 416a-p, a plurality of selection circuits 412a-d, and a plurality of entries 414a-d. To improve clarity, some similar portions of the circuit described by the data gating design 400 are omitted. Although a 16-entry, single write port device is illustrated, in other embodiments, a larger number of entries (e.g., 128 entries) and additional write ports may be used. Additionally, other entry addressing schemes may be used (e.g., addressing groups of entries). Further, additional circuitry may be included. In some embodiments, (e.g., when hierarchy design 312 is included in register file design 106 with data gating design 400), entries 414a-d may correspond to entries 302a-b of FIG. 3.

In the illustrated embodiment, plurality of entries 414a-d are configured to store write data signal 404 received from a corresponding write port. Write index signals 416a-p may indicate whether each of the plurality of entries 414a-d are addressed by the write data signal 404. For example, write index signal 416a may represent whether entry 0 of plurality of entries 414a is addressed by write data signal 404. In some embodiments, a comparator (not shown) may determine whether a write address corresponding to write data signal 404 matches an address of entry 0. Write index signal 416a may be generated from a logical AND of an output of the comparator and a write enable signal corresponding to write data signal 404. Selection circuits 412a-d may transmit the write data signal 404 to an addressed entry of plurality of entries 414a-d in response to a respective write index signal of write index signals 416a-p indicating a match. Although not illustrated, in the illustrated embodiment, write selection is performed bit-wise. Accordingly, each selection circuit 412a-d includes four selection circuits corresponding to respective individual entries of the entries 414a-d. Accordingly selection circuit 412a represents four selection circuits. As further described with respect to FIG. 6, in a system with multiple write ports, selection circuits 412a-d may be configured to selectively transmit write data signals corresponding to a write port that addresses a respective entry.

In the illustrated embodiment, prior to the write address being decoded and used to form write index signals 416a-p, the portion of the write address 402 is decoded by write pre-decode circuit 406 and used to generate enable signals 408a-d. Enable signals 408a-d indicate whether respective portions (banks) of entries are addressed by write data signal 404. Accordingly, in response to the portion of the write address 402 indicating that one of entries 4-7 414b is addressed by write data signal 404, write pre-decode circuit 406 indicates that entries 414b is addressed by write data signal 404 and that entries 414a, 414c, and 414d are not addressed by write data signal 404. Data gating circuits 410a-d are configured to prevent write data signal 404 from being provided to circuitry corresponding to entries that are not addressed by write data signal 404. In the illustrated embodiment, the portion of the write address 402 is pre-decoded so the write data signal 404 has not propagated beyond data gating circuits 410a-d prior to enable signals 408a-d reaching data gating circuits 410a-d. Accordingly, in the example, data gating circuits 410a, 410c, and 410d may prevent dynamic power usage due to portions of selection circuits 412a, 412c, and 412d switching in response to write data signal 404. Thus, power consumption of the circuit described by data gating design 400 may be smaller, as compared to a data gating design that does not use data gating circuits 410a-d.

In some embodiments, entries corresponding to a particular enable signal (e.g., enable signal 408b) are logically adjacent. The entries may correspond to a common set of most significant address bits. Additionally, entries corresponding to the particular enable signal may further be physically adjacent to each other such that in some cases routing circuitry (e.g., routing circuitry corresponding to enable signals 408a-d) is simplified. Additionally, in some cases, circuitry used to generate write index signals 416a-p may correspond to multiple signals (e.g., some portions of a comparator used to determine whether entry 0 corresponds to write data signal 404 is also used to determine whether entry 1 corresponds to write data signal 404).

As used herein, entries of a memory device are "logically adjacent" when they represent an uninterrupted series of single address increments. For example, if a device includes eight memory locations, addressed as memory locations 0-7, memory locations 1, 2, and 3 are logically adjacent, even if they are not physically adjacent (i.e., they are separated by intervening circuitry). However, as a further example, memory locations 2, 3, 5, and 6 are not logically adjacent because they do not represent an uninterrupted series of single address increments (i.e., memory location 3 is missing).

Figure 5:
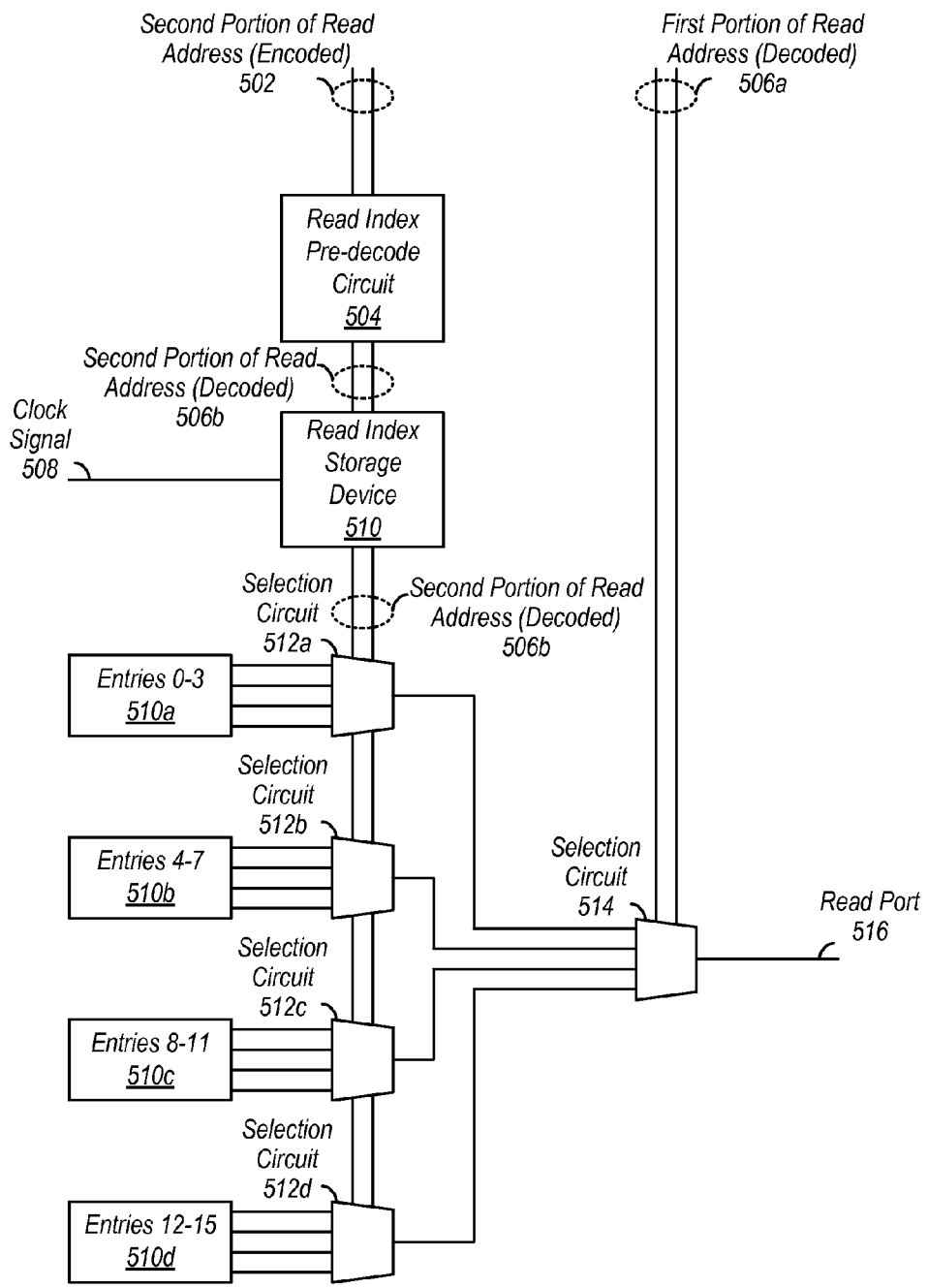
FIG. 5 is a block diagram illustrating one embodiment of a circuit described by a read acceleration design.

Turning now to FIG. 5, a block diagram illustrating an exemplary embodiment of a circuit described by read acceleration design 500 is shown. In the illustrated embodiment, read acceleration design 500 describes an encoded second portion of a read address 502, a read index pre-decode circuit 504, a first decoded portion of a read address 506a, a second decoded portion of a read address 506b, a clock signal 508, a plurality of entries 510a-d, a plurality of selection circuits 512a-d, a selection circuit 514, and a read port 516. In some embodiments, (e.g., when hierarchy design 312 is included in register file design 106 with read acceleration design 500), entries 510a-d may correspond to entries 302a-b of FIG. 3, selection circuits 512a-d and 514 may correspond to replica circuit 304a-b and circuitry 306, and read port 516 may correspond to read port 308. Similarly, in some embodiments, entries 510a-d may correspond to entries 414a-d of FIG. 4.

In some embodiments, it is desirable for data to be sent from entries 510a-d to read port as quickly as possible in response to a read address. In such a system, the circuit described by read acceleration design 500 may be used. In the illustrated embodiment, during a clock cycle prior to a clock cycle where a read operation is executed, the encoded second portion of the read address 502 is decoded by read index pre-decode circuit 504 into the decoded second portion of the read address 506b. However, because the encoded second portion of the read address 502 may be decoded prior to the clock cycle where the read operation is executed, the decoded second portion of the read address 506b may be stored at read index storage device 510 (e.g., thus enabling the circuit to pre-decode another portion of a read address during a next clock cycle).

In response to clock signal 508, read index storage device 510 may provide the decoded second portion of the read address 506b to selection circuits 512a-d (selection circuits that are directly connected to entries 510a-d). Similarly, the decoded first portion of the read address 506a may be provided to selection circuit 514 (a selection circuit that is directly connected to read port 516) in response to the clock cycle. However, in the illustrated embodiment, because read index storage device 510 is located closer to selection circuits 512a-d, as compared to a distance between a circuit that generates the first decoded portion of the read address 506a and selection circuit 514, selection circuits 512a-d are activated earlier than selection circuit 514. As a result, selection circuit 514 may wait less time for data to propagate through selection circuits 512a-d, as compared to a circuit where the input to selection circuits 512a-d (the second decoded portion of the read address 506b) is generated by the same circuit that generated the input to selection circuit 514 (the first decoded portion of the read address 506a). Accordingly, data may be received at read port 516 more quickly, as compared to a system that does not include read index pre-decode circuit 504 or read index storage device 510.

As used herein, a circuit is "directly connected" to an entry when no intervening circuits are located between the circuit and the entry. Accordingly, selection circuit 512a is directly connected to entries 0-3 510a because no intervening selection circuits are located between selection circuit 512a and entries 0-3 510a. Selection circuit 512a would still be directly connected to entries 0-3 510a if a buffer were located between selection circuit 512a and entries 0-3 510a. However, selection circuit 512a is not directly connected to read port 516 because selection circuit 514 is located between selection circuit 512a and read port 516.

In some embodiments, FIG. 5 also incorporates the principle of useful clock skewing. Useful clock skewing involves adjusting clock latencies to clocked storage devices such as flip-flops (either delaying or advancing the clock) to help improve the speed of an integrated circuit design (for example, by rebalancing/redistributing timing slack across flip-flops). There should be timing slack on at least one (either input or output) side of a flip-flop to perform useful clock skewing. When multi-bit flops are present, the opportunity to perform useful clock skewing is limited by the difference in timing slack between the data (input) and its corresponding output pin timing slacks for multiple bits across the flip-flop. By adjusting the clock going into multi-bit flops, slacks for multiple input-output pin pairs are affected.

In some embodiments, a latency associated with clock signal 508 is adjusted such that read index storage device 510 is activated prior to a circuit that generates the first decoded portion of the read address 506a. Accordingly, a system that utilizes useful clock skewing may provide additional time for selection circuits 512a-d to send data from entries identified by the second decoded portion of the read address 506b to selection circuit 514 prior to read port 516 expecting to receive the data.

Although the illustrated system includes a single read index storage device that stores two bits of the four bit read address, in other systems, multiple read index storage devices configured to provide portions of the read address to respective selection circuits (e.g., at varying distances to the entries 510a-d). Additionally, varying useful clock skewing may be implemented for the multiple read index storage devices.

Figure 6:
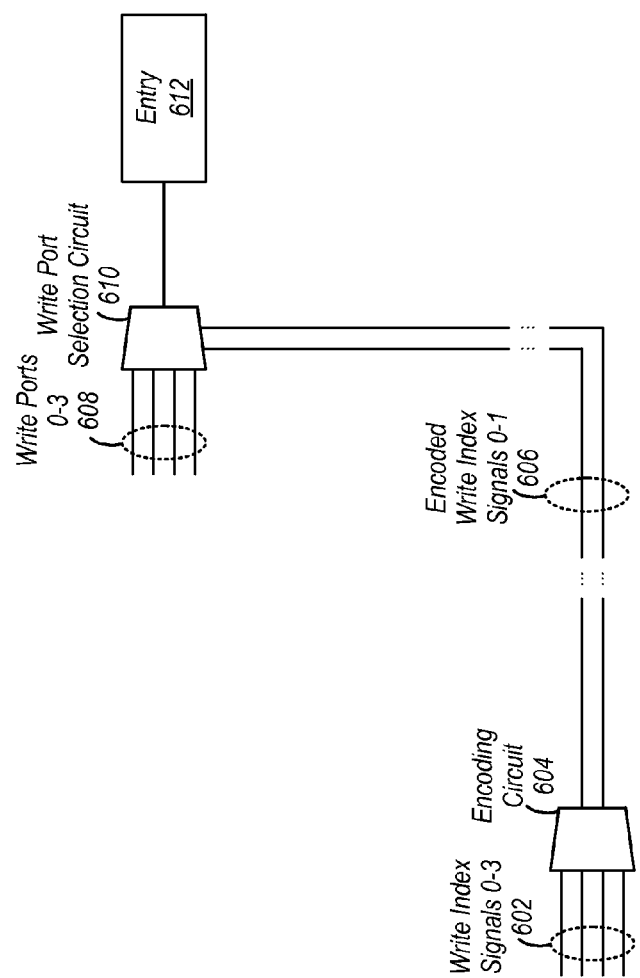
FIG. 6 is a block diagram illustrating one embodiment of a circuit described by a write routing design.

Turning now to FIG. 6, a block diagram illustrating an exemplary embodiment of a circuit described by write routing design 600 is shown. In the illustrated embodiment, write routing design 600 describes a plurality of write index signals 602, an encoding circuit 604, a plurality of encoded write index signals 606, a plurality of write ports 608, a write port selection circuit 610, and entry 612. In some embodiments, (e.g., when data gating design is included in register file design 106 with write routing design 600), one of write ports 608 may carry write data signal 404, encoded write index signals 606 may correspond to a portion of write index signals 416a-p, write port selection circuit 610 may correspond to selection circuits 412a-d, and entry 612 may correspond to one of entries 414a-d. Similarly, in some embodiments, entry 612 may correspond to entries 510a-d of FIG. 5, entries 302a-b of FIG. 3, or both. In some embodiments, repeaters, buffers, or other circuitry may be located between encoding circuit 604 and write port selection circuit 610.

Write index signals 602 indicate whether corresponding write ports of write ports 608 are writing to entry 612. For example, in one embodiment, write index signal 0 of write index signals 602 is generated by determining whether an address of entry 612 matches a write address of write port 0 of write ports 608 (e.g., using a comparator) and by performing a logical AND between the result of the comparison and a write enable of write port 0. Write index signals 1-3 of write index signals 602 may be similarly generated. Write index signals 602 may instruct write port selection circuit 610 to electrically connect corresponding write ports of write ports 608 to entry 612 (e.g., so the corresponding write port can transmit write data to entry 612).

In the illustrated embodiment, although entry 612 may be written to by any of write ports 608, entry 612 can only be written to by one write port of write ports 608 at a time. Accordingly, write index signals 602 may be one-hot (at most one write index signal indicates a write from a corresponding write port at a time). Additionally, in some embodiments, routing write index signals 602 across the register file circuit may consume an undesirable amount of area. Accordingly, in the illustrated embodiment, because write index signals 602 are one-hot, the four write index signals 602 may be encoded into two-bit encoded write index signals 606 by encoding circuit 604. Write port selection circuit 610 may decode the encoded write index signals 606 to determine which (if any) of write ports 608 to electrically connect to entry 612. Accordingly, in some embodiments, routing area may be saved at the expense of encoding and decoding write index signals 602. The routing area savings may increase as entries and/or number of write ports increases. For example, in a register file circuit having 32 write ports and 1024 entries, the 32 write index signals may be reduced to 5 wires, thus saving 27 wires for each entry, a total savings of 32,768 wires. Additionally, if repeaters, buffers, or other circuitry is located between encoding circuit 604 and write port selection circuit 610, some duplication of such circuitry may also be saved.

Figure 7:
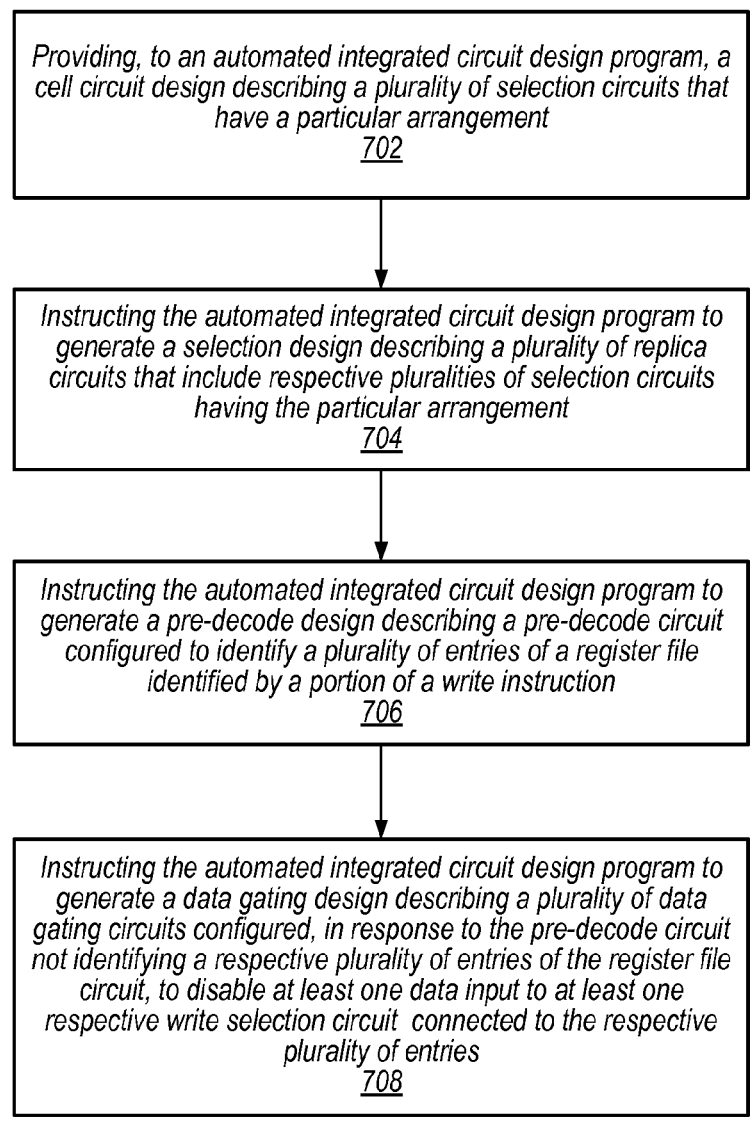
FIG. 7 is a flow diagram illustrating a first embodiment of a method of generating a register file circuit design.

Turning now to FIG. 7, a flow diagram of a method 700 is depicted. Method 700 is an embodiment of a method of generating a register file circuit design, such as register file design 106 of FIG. 1. In some embodiments, as described further below, method 700 may be initiated or performed by one or more processors in response to one or more instructions stored by a computer-readable storage medium. Some portions of method 700 may be performed in other orders or simultaneously.

At 702, method 700 includes providing, to an automated integrated circuit design program, a cell circuit design describing a plurality of selection circuits that have a particular arrangement. For example, method 700 may include sending, to automated design program 104, cell circuit design 110 describing a plurality of selection circuits that have a particular arrangement.

At 704, method 700 includes instructing the automated circuit design program to generate a selection design describing a plurality of replica circuits that include respective pluralities of selection circuits having the particular arrangement. For example, method 700 may include providing selection design instructions 112 to automated design program 104, instructing automated design program 104 to generate a design describing hierarchy design 312 that includes replica circuits 304a-b that include respective selection circuits having the particular arrangement of cell circuit design 110.

At 706, method 700 includes instructing the automated integrated circuit design program to generate a pre-decode design describing a pre-decode circuit configured to identify a plurality of entries of a register file identified by a portion of a write instruction. For example, method 700 may include providing write pre-decode design instructions 114 to automated design program 104, instructing automated design program 104 to generate a design describing write pre-decode circuit 406 that is configured to identify, using enable signals 408a-d, a plurality of entries 414 a-d identified by the portion of the write address 402.

At 708, method 700 includes instructing the automated integrated circuit design program to generate a data gating design describing a plurality of data gating circuits configured, in response to the pre-decode circuit not identifying a respective plurality of entries of the register file circuit, to disable at least one data input to at least one respective write selection circuit connected to the respective plurality of entries. For example, method 700 may include providing gating design instructions 116 to automated design program 104, instructing automated design program 104 to generate a design describing data gating circuits 410a-d that are configured, in response to enable signals 408a-d not identifying a respective plurality of entries 414a-d, to disable (or block) write data signal 404 from being sent to selection circuits 412a-d.

Figure 8:
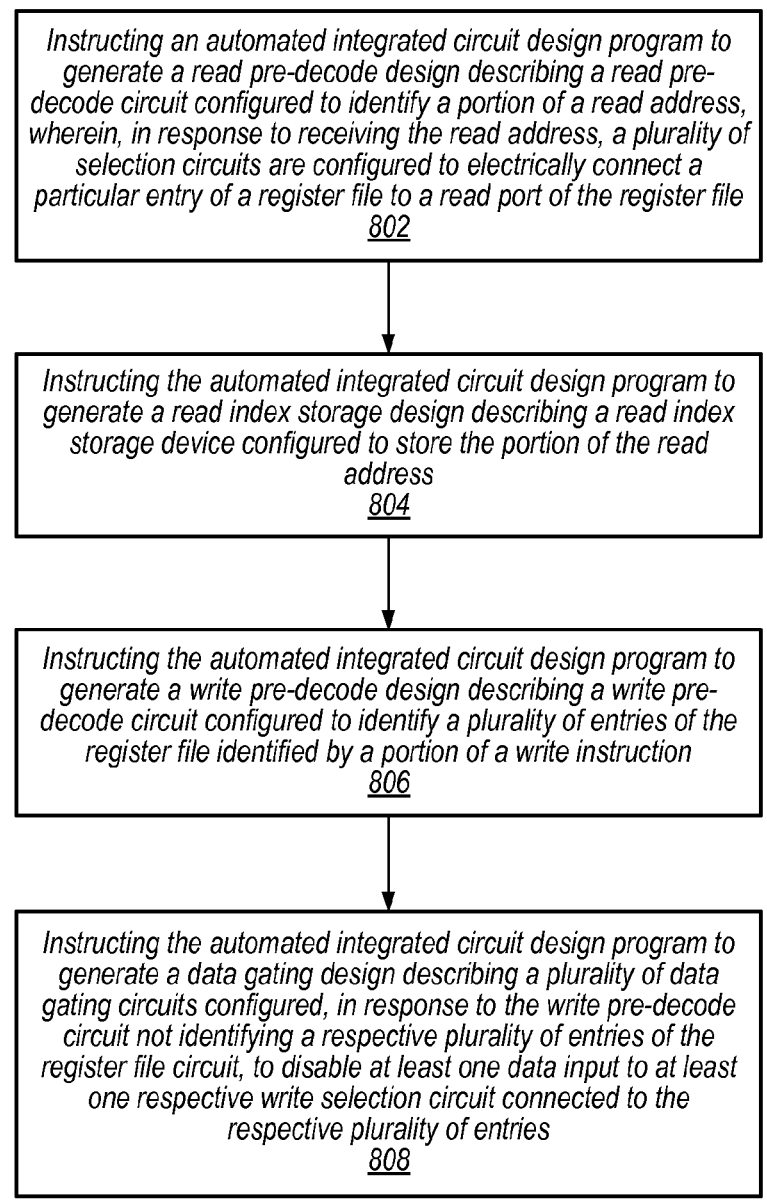
FIG. 8 is a flow diagram illustrating a second embodiment of a method of generating a register file circuit design.

Turning now to FIG. 8, a flow diagram of a method 800 is depicted. Method 800 is an embodiment of a method of generating a register file circuit design, such as register file design 106 of FIG. 1. In some embodiments, as described further below, method 800 may be initiated or performed by one or more processors in response to one or more instructions stored by a computer-readable storage medium. Some portions of method 800 may be performed in other orders or simultaneously.

At 802, method 800 includes instructing an automated integrated circuit design program to generate a read pre-decode design describing a read pre-decode circuit configured to identify a portion of a read address. In response to receiving the read address, a plurality of selection circuits are configured to electrically connect a particular entry of a register file to a read port of the register file. For example, method 800 may include providing read pre-decode design instructions 118 to automated design program 104, instructing automated design program 104 to generate a design describing read index pre-decode circuit 504 configured to identify (e.g., decode) the second encoded portion of read address 502. In response to the decoded read address 506a-b, selection circuits 512a-d, 514 may electrically connect a particular entry of entries 510a-d to read port 516.

At 804, method 800 includes instructing the automated circuit design program to generate a read index storage design describing a read index storage device configured to store the portion of the read address. For example, method 800 may include providing read index storage design instructions 120 to automated design program 104, instructing automated design program 104 to generate a design describing read index storage device 510 configured to store the second decoded portion of the read address 506b.

At 806, method 800 includes instructing the automated integrated circuit design program to generate a write pre-decode design describing a write pre-decode circuit configured to identify a plurality of entries of a register file identified by a portion of a write instruction. For example, method 800 may include providing write pre-decode design instructions 114 to automated design program 104, instructing automated design program 104 to generate a design describing write pre-decode circuit 406 that is configured to identify, using enable signals 408a-d, a plurality of entries 414a-d identified by the portion of the write address 402.

At 808, method 800 includes instructing the automated integrated circuit design program to generate a data gating design describing a plurality of data gating circuits configured, in response to the write pre-decode circuit not identifying a respective plurality of entries of the register file circuit, to disable at least one data input to at least one respective write selection circuit connected to the respective plurality of entries. For example, method 800 may include providing gating design instructions 116 to automated design program 104, instructing automated design program 104 to generate a design describing data gating circuits 410a-d that are configured, in response to enable signals 408a-d not identifying a respective plurality of entries 414a-d, to disable (or block) write data signal 404 from being sent to selection circuits 412a-d.

Figure 9:
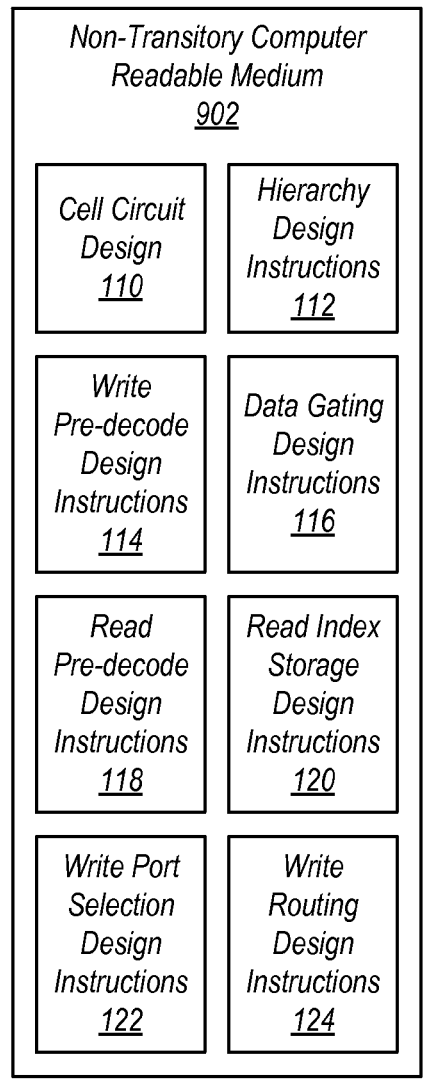
FIG. 9 is a block diagram illustrating one embodiment of a non-transitory computer readable medium.

Turning now to FIG. 9, a block diagram of one embodiment a system 900 including a non-transitory computer readable medium 902 is shown. Non-transitory computer readable medium 902 includes data objects (cell circuit design 110, selection design instructions 112, write pre-decode design instructions 114, gating design instructions 116, read pre-decode design instructions 118, read index storage design instructions 120, write port selection design instructions 122, and routing design instructions 124) that, collectively, instruct automated design program 104 to generate a register file circuit design such as register file design 106 including particular design features (e.g., hierarchy design 312, data gating design 400, read acceleration design 500, write routing design 600, or any combination thereof). In some embodiments, a subset of the illustrated data objects may be stored on non-transitory computer readable medium 902. Similarly, other data objects may additionally be stored on non-transitory computer readable medium 902. Non-transitory computer readable medium 902 may be located within design request system 126, fabrication system 128, or another computer device (e.g., a computer device configured to run automated design program 104).

The data objects may include one or more respective instructions, that when executed by a processor in a computer, implement the operations described for the corresponding data object. Generally speaking, a computer accessible storage medium may include any storage media accessible by a computer during use to provide instructions and/or data to the computer. For example, a computer accessible storage medium may include non-transitory storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, non-transitory computer readable medium 902 may store data in a non-transitory manner, where non-transitory in this context may refer to not transmitting the instructions/data on a signal. For example, non-transitory storage may be volatile (and may lose the stored instructions/data in response to a power down) or non-volatile.

Figure 10:
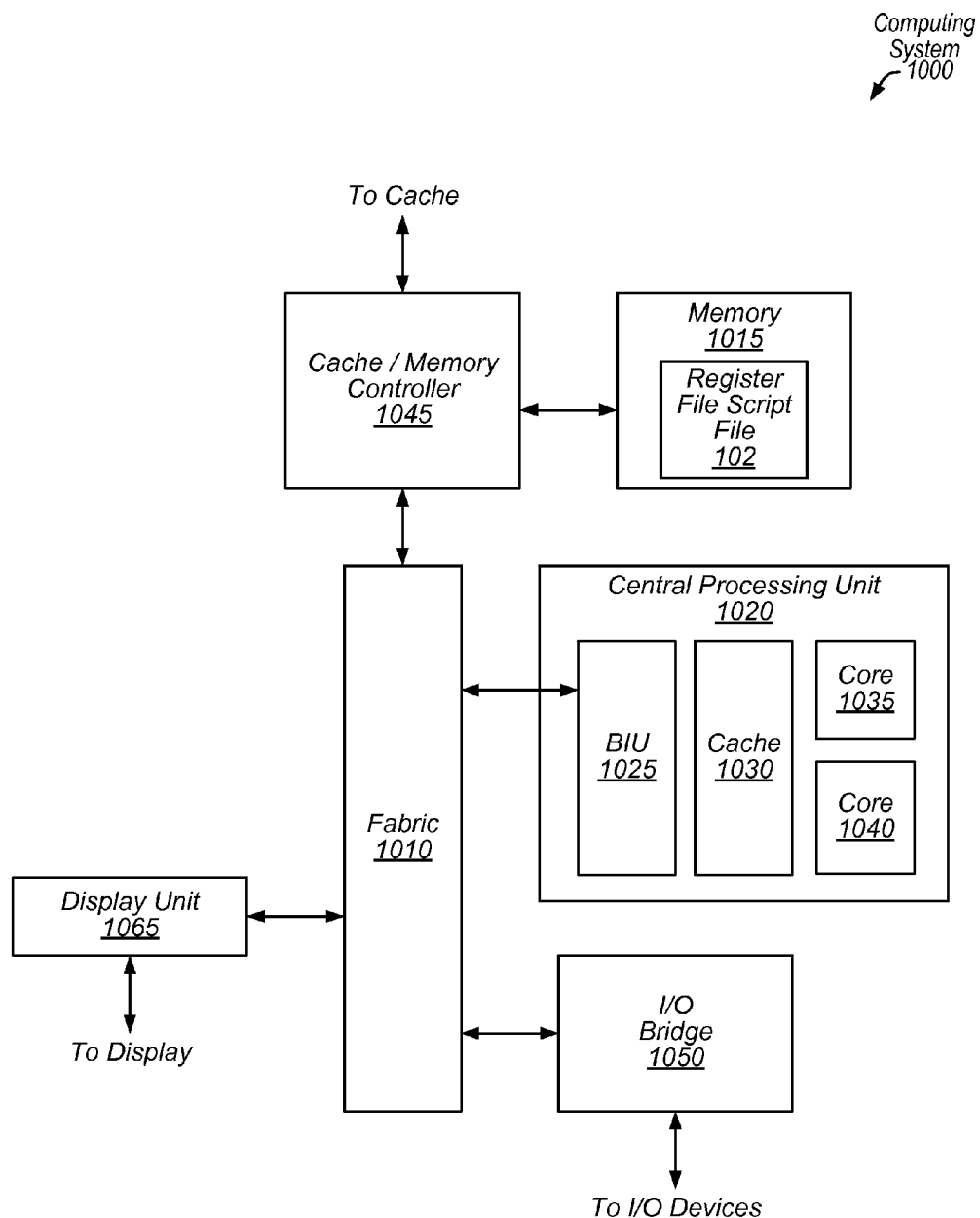
FIG. 10 is block diagram illustrating an embodiment of an exemplary computing system used to perform at least a portion of a register file circuit design process.

Turning next to FIG. 10, a block diagram illustrating an exemplary embodiment of a computing system 1000 configured to perform at least a portion of a register file circuit design process is shown. Computing system 1000 includes register file script file 102. In some embodiments, computing system 1000 corresponds to design request system 126. In other embodiments, computing system 1000 corresponds to a computing system configured to run automated design program 104. In some embodiments, computing system 1000 includes one or more of the data objects described above with reference to FIGS. 1-9, including any variations or modifications described previously with reference to FIGS. 1-9. In some embodiments, some or all elements of computing system 1000 may be included within a system on a chip (SoC). In some embodiments, computing system 1000 is included in a mobile device. In the illustrated embodiment, computing system 1000 includes fabric 1010, central processing unit (CPU) complex 1020, input/output (I/O) bridge 1050, cache/memory controller 1045, memory 1015, and display unit 1065. Although computing system 1000 illustrates register file script file 102 as being located in memory 1015, in other embodiments, register file script file 102 may be included in other components of computing system 1000 (e.g., cache 1030). Additionally or alternatively, computing system 1000 may include multiple register file script files. The multiple register file script files may correspond to different designs (e.g., including different data objects) or to the same designs.

Fabric 1010 may include various interconnects, buses, MUXes, controllers, etc., and may be configured to facilitate communication between various elements of computing system 1000. In some embodiments, portions of fabric 1010 are configured to implement various different communication protocols. In other embodiments, fabric 1010 implements a single communication protocol and elements coupled to fabric 1010 may convert from the single communication protocol to other communication protocols internally.

In the illustrated embodiment, CPU complex 1020 includes bus interface unit (BIU) 1025, cache 1030, and cores 1035 and 1040. In various embodiments, CPU complex 1020 includes various numbers of cores and/or caches. For example, CPU complex 1020 may include 1, 2, or 4 processor cores, or any other suitable number. In an embodiment, cache 1030 is a L2 cache. In some embodiments, cores 1035 and/or 1040 include internal instruction and/or data caches. In some embodiments, a coherency unit (not shown) in fabric 1010, cache 1030, or elsewhere in computing system 1000 is configured to maintain coherency between various caches of computing system 1000. BIU 1025 may be configured to manage communication between CPU complex 1020 and other elements of computing system 1000. Processor cores such as cores 1035 and 1040 may be configured to execute instructions of a particular instruction set architecture (ISA), which may include operating system instructions and user application instructions.

Cache/memory controller 1045 may be configured to manage transfer of data between fabric 1010 and one or more caches and/or memories (e.g., non-transitory computer readable mediums). For example, cache/memory controller 1045 may be coupled to an L3 cache, which may, in turn, be coupled to a system memory. In other embodiments, cache/memory controller 1045 is directly coupled to a memory, such as memory 1015. In some embodiments, the cache/memory controller 1045 includes one or more internal caches. In some embodiments, the cache/memory controller 1045 may include or be coupled to one or more caches and/or memories that include instructions that, when executed by one or more processors (e.g., the CPU complex 1020 and/or one or more cores 1035, 1040 of the CPU complex 1020), cause the processor, processors, or cores to initiate or perform some or all of the processes described above with reference to FIGS. 7 and 8. In some embodiments, memory 1015 may correspond to non-transitory computer readable medium 902 of FIG. 9. Accordingly, in some embodiments, one or more caches and/or memories coupled to the cache/memory controller 1045 store information that, when executed by a processor, cause the processor to initiate or perform at least a portion of a register file circuit design process.

As used herein, the term "coupled to" may indicate one or more connections between elements, and a coupling may include intervening elements. For example, in FIG. 10, display unit 1065 may be described as "coupled to" the CPU complex 1020 through fabric 1010. In contrast, in the illustrated embodiment of FIG. 10, display unit 1065 is "directly coupled" to fabric 1010 because there are no intervening elements.

Display unit 1065 may be configured to read data from a frame buffer and provide a stream of pixel values for display. Display unit 1065 may be configured as a display pipeline in some embodiments. Additionally, display unit 1065 may be configured to blend multiple frames to produce an output frame. Further, display unit 1065 may include one or more interfaces (e.g., MIPI® or embedded display port (eDP)) for coupling to a user display (e.g., a touchscreen or an external display).

I/O bridge 1050 may include various elements configured to implement: universal serial bus (USB) communications, security, audio, and/or low-power always-on functionality, for example. I/O bridge 1050 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 1000 via I/O bridge 1050.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
   instructing an automated integrated circuit design program to automatically generate a register file circuit design, wherein the instructing comprises:
   providing, to the automated integrated circuit design program, a cell circuit design describing a plurality of selection circuits that have a particular arrangement;
   instructing the automated integrated circuit design program to generate a selection design describing a plurality of replica circuits that include respective pluralities of selection circuits having the particular arrangement;
   instructing the automated integrated circuit design program to generate a pre-decode design describing a pre-decode circuit configured to identify a plurality of entries of the register file circuit identified by a portion of a write instruction; and
   instructing the automated integrated circuit design program to generate a data gating design describing a plurality of data gating circuits configured, in response to the pre-decode circuit not identifying a respective plurality of entries of the register file circuit, to disable at least one data input to at least one respective write selection circuit connected to the respective plurality of entries.

2. The method of claim 1, wherein instructing the automated integrated circuit design program to generate the register file circuit design includes passing one or more scripts to the automated integrated circuit design program, wherein the one or more scripts include the cell circuit design and further include instructions to generate the selection design, the pre-decode design, and the data gating design.

3. The method of claim 1, wherein instructing the automated integrated circuit design program to generate the selection design comprises specifying placement of the plurality of replica circuits within the register file circuit design.

4. The method of claim 1, wherein instructing the automated integrated circuit design program to generate the register file circuit design comprises instructing the automated integrated circuit design program to attempt to improve portions of the register file circuit design not described by the cell circuit design based on an estimated timing of the circuits described by the register file circuit design, an estimated power consumption of the circuits described by the register file circuit design, an estimated area of the circuits described by the register file circuit design, or any combination thereof.

5. The method of claim 1, wherein instructing the automated integrated circuit design program to generate the register file circuit design further comprises instructing the automated integrated circuit design program to generate a read pre-decode design describing a read pre-decode circuit configured to identify a portion of a read address, and wherein, in response to receiving the read address, the plurality of replica circuits are configured to electrically connect a particular entry of the register file circuit to a read port of the register file circuit.

6. The method of claim 5, wherein instructing the automated integrated circuit design program to generate the register file circuit design further comprises instructing the automated integrated circuit design program to generate a read index storage design describing a read index storage device configured to store the portion of the read address.

7. The method of claim 1, wherein instructing the automated integrated circuit design program to generate the register file circuit design further comprises instructing the automated integrated circuit design program to generate a write port selection design describing a plurality of write selection circuits including the at least one respective write selection circuit of the data gating design, wherein the plurality of write selection circuits are configured, in response to a plurality of write port selection signals, to electrically connect a particular entry of the register file circuit to a particular write port of the register file circuit.

8. The method of claim 7, wherein instructing the automated integrated circuit design program to generate the register file circuit design further comprises instructing the automated integrated circuit design program to generate a write routing design describing encoding circuitry configured to:
  encode a plurality of write index signals; and
  send the plurality of write index signals to the plurality of write selection circuits such that the plurality of write port selection signals are routed within the register file circuit design as an encoded plurality of write port selection signals, wherein the plurality of write selection circuits are configured, in response to the encoded plurality of write port selection signals, to electrically connect the particular entry to the particular write port.

9. The method of claim 1, wherein the cell circuit design describes the plurality of entries connecting to the plurality of selection circuits, and wherein the plurality of replica circuits include the plurality of entries connected to the plurality of selection circuits.

10. A method, comprising:
  instructing an automated integrated circuit design program to automatically generate a register file circuit design, wherein the instructing comprises:
    instructing the automated integrated circuit design program to generate a read pre-decode design describing a read pre-decode circuit configured to identify a portion of a read address, wherein the read address is configured to cause a plurality of selection circuits to electrically connect a particular entry of the register file circuit to a read port of the register file circuit;
    instructing the automated integrated circuit design program to generate a read index storage design describing a read index storage device configured to store the portion of the read address;
    instructing the automated integrated circuit design program to generate a write pre-decode design describing a write pre-decode circuit configured to identify a plurality of entries of the register file circuit identified by a portion of a write instruction; and
    instructing the automated integrated circuit design program to generate a data gating design describing a plurality of data gating circuits configured, in response to the write pre-decode circuit not identifying a respective plurality of entries of the register file circuit, to disable at least one data input to at least one respective write selection circuit connected to the respective plurality of entries.

11. The method of claim 10, wherein instructing the automated integrated circuit design program to generate the register file circuit design includes passing one or more scripts to the automated integrated circuit design program, wherein the one or more scripts include instructions to generate the read pre-decode design, the read index storage design, the write pre-decode design, and the data gating design.

12. The method of claim 10, wherein the read index storage device is configured to send at least one bit of the portion of the read address to a particular selection circuit of the plurality of selection circuits, wherein the particular selection circuit is directly connected to respective entries of the register file circuit.

13. The method of claim 10, wherein the portion of the read address does not correspond to a particular selection circuit of the plurality of selection circuits, wherein the particular selection circuit is directly connected to the read port.

14. The method of claim 10, wherein the read index storage design indicates that a clock connection of the read index storage device is configured to receive an advanced clock signal that triggers earlier than a clock signal used by another device of the register file circuit.

15. A non-transitory computer readable storage medium storing program instructions that, when executed by one or more processors, cause the one or more processors to carry out operations comprising:
  instructing an automated integrated circuit design program to automatically generate a register file circuit design, wherein the instructing comprises:
    providing, to the automated integrated circuit design program, a cell circuit design describing a plurality of selection circuits that have a hierarchical arrangement;
    instructing the automated integrated circuit design program to generate a hierarchy design describing a plurality of replica circuits that include respective pluralities of selection circuits having the hierarchical arrangement;
    instructing the automated integrated circuit design program to generate a pre-decode design describing a pre-decode circuit configured to identify a plurality of entries of the register file circuit identified by a portion of a write instruction; and
    instructing the automated integrated circuit design program to generate a data gating design describing a plurality of data gating circuits configured, in response to the pre-decode circuit not identifying a respective plurality of entries of the register file circuit, to disable at least one data input to at least one respective write selection circuit connected to the respective plurality of entries.

16. The non-transitory computer readable storage medium of claim 15, wherein instructing the automated integrated circuit design program to generate the register file circuit design includes passing one or more scripts to the automated integrated circuit design program, wherein the one or more scripts include the cell circuit design and further include instructions to generate the hierarchy design, the pre-decode design, and the data gating design.

17. The non-transitory computer readable storage medium of claim 15, wherein the data gating design describes the respective plurality of entries corresponding to the disabled at least one data input as being logically adjacent.

18. The non-transitory computer readable storage medium of claim 15, wherein instructing the automated integrated circuit design program to generate the register file circuit design includes specifying irregular dimensions for the register file circuit design.

19. The non-transitory computer readable storage medium of claim 15, wherein the cell circuit design includes a synthesizable hardware description language script that describes the plurality of selection circuits.

20. The non-transitory computer readable storage medium of claim 15, wherein the cell circuit design includes a netlist script that describes connections between the plurality of selection circuits.

* * * * *